United States Patent
Ota et al.

(10) Patent No.: US 10,751,912 B2
(45) Date of Patent: Aug. 25, 2020

(54) ALUMINUM-DIAMOND-BASED COMPOSITE AND METHOD FOR PRODUCING SAME

(71) Applicant: DENKA COMPANY LIMITED, Tokyo (JP)

(72) Inventors: Hiroaki Ota, Omuta (JP); Takeshi Miyakawa, Omuta (JP); Yosuke Ishihara, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 231 days.

(21) Appl. No.: 15/765,931

(22) PCT Filed: Oct. 11, 2016

(86) PCT No.: PCT/JP2016/080146
§ 371 (c)(1),
(2) Date: Apr. 4, 2018

(87) PCT Pub. No.: WO2017/065139
PCT Pub. Date: Apr. 20, 2017

(65) Prior Publication Data
US 2018/0281230 A1 Oct. 4, 2018

(30) Foreign Application Priority Data
Oct. 13, 2015 (JP) .................. 2015-202162

(51) Int. Cl.
*B22F 7/02* (2006.01)
*B28B 19/00* (2006.01)
(Continued)

(52) U.S. Cl.
CPC ........ *B28B 19/0015* (2013.01); *B22D 21/007* (2013.01); *B22F 7/04* (2013.01);
(Continued)

(58) Field of Classification Search
None
See application file for complete search history.

(56) References Cited

U.S. PATENT DOCUMENTS 10,358,704 B2 * 7/2019 Ishihara .................. B32B 15/01
2005/0074355 A1 4/2005 Pickard et al.
(Continued)

FOREIGN PATENT DOCUMENTS

JP 09157773 A 6/1997
JP 2000303126 A 10/2000
(Continued)

OTHER PUBLICATIONS

International Search Report from corresponding PCT/JP2016/080146 dated Jan. 17, 2017.
(Continued)

*Primary Examiner* — Seth Dumbris
(74) *Attorney, Agent, or Firm* — Caesar Rivise, PC

(57) ABSTRACT

The present invention provides an aluminum-diamond composite which combines high thermal conductivity and a coefficient of thermal expansion close to a semiconductor element, and in which the difference between the thicknesses of both surfaces is reduced so as to be suitable for use as a heat sink etc. for a semiconductor element. Provided is a flat plate-shaped aluminum-diamond composite that has an aluminum-diamond composite part and a surface layer that coats both surfaces of the composite part and includes a metal that has aluminum as a principal component, wherein: the composite part is composed of a composite material that is composed of an aluminum or aluminum alloy matrix and diamond particles dispersed in said matrix; the composite material is composed of a diamond powder in which diamond particles having a particle size of 1-20 µm, inclusive, make up 10-40 vol % of the diamond particles and diamond particles having a particle size of 100-250 µm, inclusive,
(Continued)

make up 50-80 vol %, said powder not containing diamond particles having a particle size of less than 1 μm or diamond particles having a particle size of more than 250 μm; and the average value for the differences in in-plane thickness per 50 mm×50 mm is 100 μm or less.

9 Claims, 2 Drawing Sheets

(51) Int. Cl.
| | |
|---|---|
| *C22C 26/00* | (2006.01) |
| *C22C 21/00* | (2006.01) |
| *C04B 41/88* | (2006.01) |
| *C04B 41/00* | (2006.01) |
| *H01L 21/48* | (2006.01) |
| *C04B 41/51* | (2006.01) |
| *B22D 21/00* | (2006.01) |
| *C22C 1/10* | (2006.01) |
| *C22C 21/04* | (2006.01) |
| *B22F 7/04* | (2006.01) |
| *B28B 11/24* | (2006.01) |
| *C09K 5/14* | (2006.01) |
| *F28F 21/08* | (2006.01) |
| *H01L 23/373* | (2006.01) |
| *C22C 21/02* | (2006.01) |

(52) U.S. Cl.
CPC .......... *B28B 11/243* (2013.01); *C04B 41/009* (2013.01); *C04B 41/5155* (2013.01); *C04B 41/88* (2013.01); *C09K 5/14* (2013.01); *C22C 1/1036* (2013.01); *C22C 21/00* (2013.01); *C22C 21/04* (2013.01); *C22C 26/00* (2013.01); *F28F 21/084* (2013.01); *H01L 21/4871* (2013.01); *H01L 23/3732* (2013.01); *C22C 21/02* (2013.01); *F28F 2255/06* (2013.01)

(56) References Cited

U.S. PATENT DOCUMENTS

| | | | | |
|---|---|---|---|---|
| 2011/0198771 | A1* | 8/2011 | Hirotsuru | B22D 19/00 264/45.3 |
| 2014/0182824 | A1* | 7/2014 | Hirotsuru | C25D 5/12 165/133 |
| 2017/0268834 | A1 | 9/2017 | Ishihara et al. | |

FOREIGN PATENT DOCUMENTS

| | | |
|---|---|---|
| JP | 2007518875 A | 7/2007 |
| JP | 2012158817 A | 8/2012 |
| WO | 2010007974 A1 | 1/2010 |
| WO | 2013015158 A1 | 1/2013 |
| WO | 2016035789 A1 | 3/2016 |

OTHER PUBLICATIONS

English language abstract for JP 09157773 A (1997).
English language abstract for JP 2000303126 A (2000).
English language abstract for JP 2012158817 A (2012).

* cited by examiner

[FIG. 1]
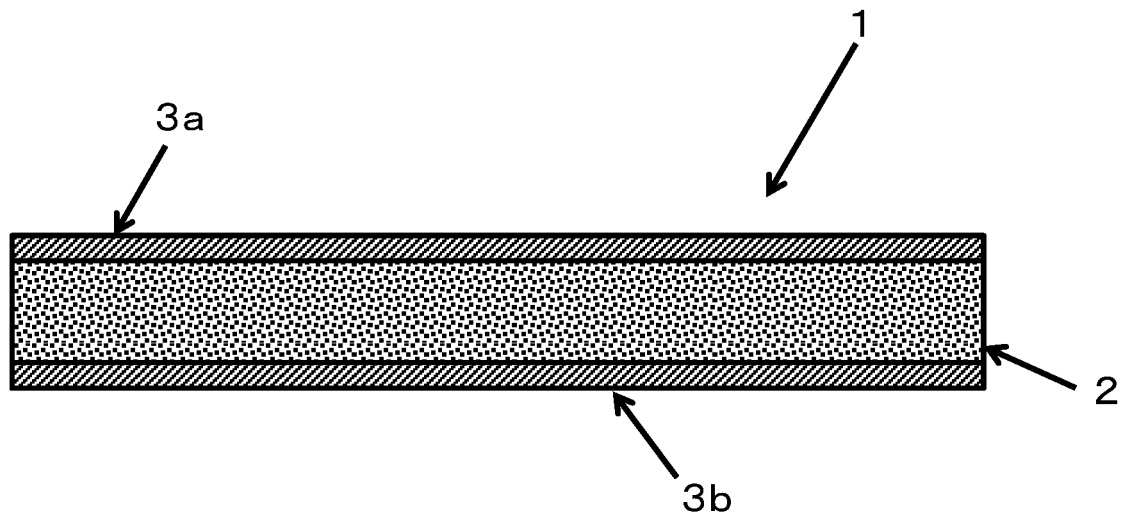
[FIG. 2]
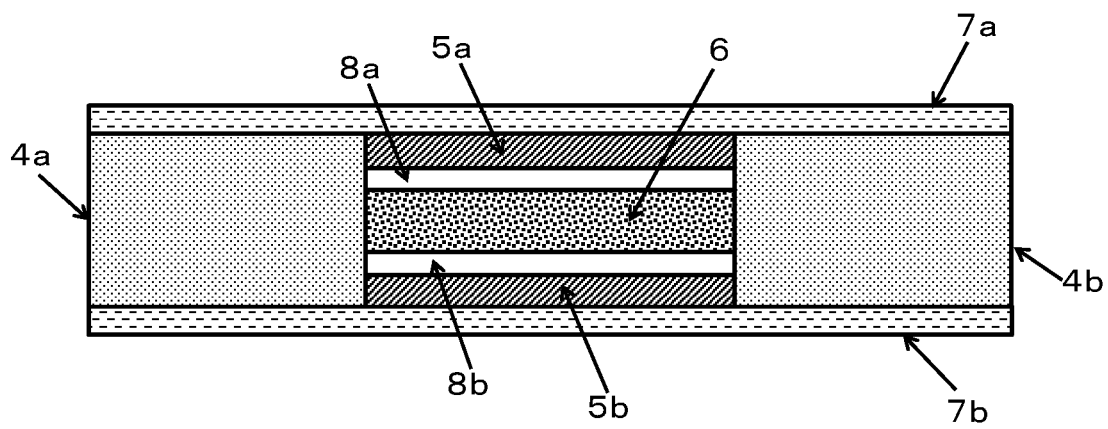

[FIG. 3]
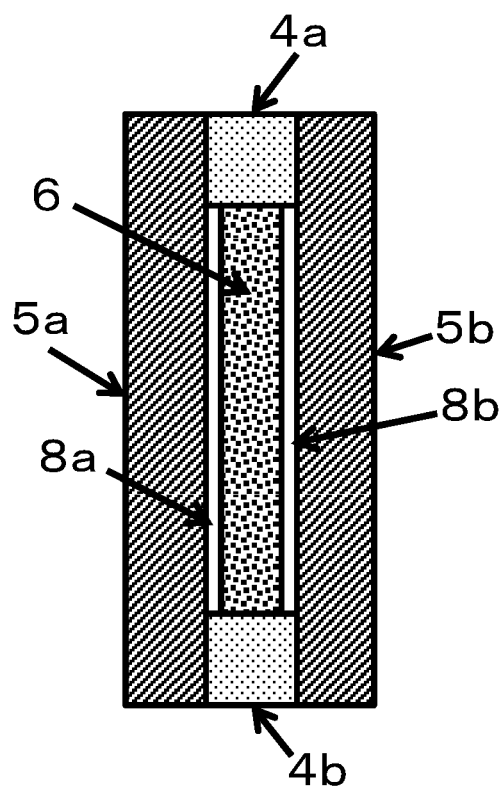

ALUMINUM-DIAMOND-BASED COMPOSITE AND METHOD FOR PRODUCING SAME

CROSS-REFERENCE TO RELATED APPLICATIONS

This application is the U.S. National Phase Application of PCT/JP2016/080146, filed Oct. 11, 2016, which claims priority from JP 2015-202162, filed Oct. 13, 2015, the contents of which applications are incorporated herein by reference in their entireties for all purposes.

TECHNICAL FIELD

The present invention relates to an aluminum-diamond-based composite and a method for producing the same.

BACKGROUND ART

Generally, it is important for a semiconductor element such as a semiconductor laser element and a high-frequency element used in the optical communication field and the like to efficiently release heat generated from the element during operation, in order to prevent malfunction or failure. Recently, technological development of semiconductor elements has promoted the speed, power, and high integration of the elements, and a demand for the heat dissipation has become increasingly more challenging. Thus, in general, a high thermal conductivity has been also required for heat dissipating components such as a heat sink, and copper (Cu) having a high thermal conductivity of 390 W/mK has been used.

On the other hand, the size of individual semiconductor element has been increased with an increase in output power, and problems of a thermal expansion mismatch between the semiconductor element and the heat sink used for heat dissipation have become apparent. To solve these problems, there is a need for development of a heat sink material exhibiting high thermal conductivity and a coefficient of thermal expansion equivalent to that of the semiconductor element. As such a material, a prior art proposes a composite of a metal and a ceramic, for example, a composite of aluminum (Al) and silicon carbide (SiC) (Patent Document 1).

However, the Al—SiC composite only has a thermal conductivity of 300 W/mK or less even if the conditions are optimized. Therefore, there is a need for development of the heat sink material having higher thermal conductivity. As such a material, a prior art proposes a metal-diamond composite having a high thermal conductivity and a coefficient of thermal expansion close to that of the semiconductor element, by a combination of the high thermal conductivity of diamond and the large coefficient of thermal expansion of the metal (Patent Document 2).

Further, a prior art discloses that forming of β-type SiC layers on surfaces of diamond particles suppresses generation of a metal carbide having a low coefficient of thermal expansion formed during production of a composite and improves wettability to a molten metal, thereby improving thermal conductivity of a diamond composite material obtained (Patent Document 3).

In the production of a metal-ceramics composite, a step of molding ceramics powder conventionally uses a powder filling method or a preform method. In the preform method, a porous molded body can be produced by sintering the ceramic particles or mixing them with an inorganic binder, molding them and then firing them, which is expected to improve dimensional accuracy. However, the power filling method has a problem that it cannot be applied to ceramic particles which cannot be sintered, such as graphite or diamond. Further, the preform method has a disadvantage that the heat conductivity of the heat sink is decreased because the inorganic binder is present in the resulting composite. To solve the problems, the applicant of the present application developed a process for producing an aluminum-diamond-based composite using the powder filling method, by placing diamond grains in the form of powder in a porous mold member, sandwiching them between dense mold release plates to which a mold releasing agent has been applied, to form a structured body, and carrying out molten metal forging with molten aluminum (Patent Document 4).

CITATION LIST

Patent Document 1: Japanese Patent Application Publication No. H09-157773 A
Patent Document 2: Japanese Patent Application Publication No. 2000-303126 A
Patent Document 3: Japanese Patent Application Publication No. 2007-518875 A
Patent Document 4: WO 2010/007974 A1

SUMMARY OF INVENTION

Technical Problem

According to the powder filling method disclosed in Patent Document 4, it is possible to produce a heat sink using diamond grains without decreasing the thermal conductivity. However, with this method, a variation is generated when the powder was placed in the mold member, so that it was difficult to flatly and uniformly fill the powder. In addition, when the raw material powder mixed with particles having different particle size distributions was used, coarse particles and fine particles may be separated at the upper and lower portions of the filled body during the process of filling. There is also a problem that when such a filled body is impregnated with the molten aluminum, the coefficient of thermal expansion of the resulting aluminum-diamond-based composite will also generate a difference between the upper and lower portions of the composite, causing warpage and the like.

On the other hand, since the surface of the semiconductor or the heat sink is not perfectly smooth, these bonding boundary surfaces do not completely adhere to each other when observing a microscope and have gaps. The gaps remarkably deteriorates the heat dissipation characteristics of the heat sink, so that thermal grease or the like is used to fill the gaps. However, the thermal conductivity of the thermal grease is generally about several W/mK, and it is thus desirable to decrease the amount of grease applied. Therefore, there is also need for improvement of surface accuracy for the heat sink.

Thus, an object of the present invention is to provide an aluminum-diamond-based composite which can have both a high thermal conductivity and a coefficient of thermal expansion close to that of the semiconductor element, and which can further have a decreased in-plane thickness difference between both surfaces so as to be suitable for use as a heat sink.

Solution to Problem

In one aspect, the present invention relates to a method for producing an aluminum-diamond-based composite, comprising the following steps 1) to 6):

1) adding 0.5 to 20 parts by mass of at least one organic binder and 10 to 60 parts by mass of at least one solvent to 100 parts by mass of diamond powder to obtain a slurry, wherein the diamond powder comprises 10 to 40% by volume of diamond particles each having a particle diameter of 1 μm or more and 20 μm or less, 50 to 80% by volume of diamond particles each having a particle diameter of 100 μm or more and 250 μm or less, and wherein the diamond powder does not comprise diamond particles each having a particle diameter of less than 1 μm and diamond particles each having a particle diameter of more than 250 μm;

2) molding the slurry to prepare a flat plate-shaped molded body of diamond particles, wherein the flat plate-shaped molded body has an average value of in-plane thickness differences of 100 μm or less in a square of 50 mm×50 mm;

3) forming a structured body in which the molded body is filled in a mold member while sandwiching both surfaces of the molded body by aluminum foils or aluminum alloy foils and mold release plates, heating the structured body at a temperature higher than or equal to a decomposition temperature of the organic binder and then compressing the structured body in a thickness direction;

4) heating the structured body at a temperature of from 600 to 750° C.;

5) impregnating the structured body heated at a temperature of from 600 to 750° C. with aluminum or aluminum alloy heated at a temperature higher than or equal to its melting point to form a flat plate-shaped aluminum-diamond-based composite base material in which both surfaces of the base material are coated with surface layers each containing a metal whose main component is aluminum; and 6) processing the aluminum-diamond-based composite base material.

In one embodiment of the method for producing the aluminum-diamond-based composite according to the present invention, the method further comprises a step of processing the diamond molded body, after the step 2) and before the step 3) of heating the diamond molded body.

In another embodiment of the method for producing the aluminum-diamond-based composite according to the present invention, the step 6) of processing the aluminum-diamond-based composite base material comprises carrying out at least one of a side surface-processing and a hole portion-forming.

In yet another embodiment of the method for producing the aluminum-diamond-based composite according to the present invention, each of the diamond particles comprises a layer of β-type silicon carbide chemically bonded to a surface of each diamond particle.

In another aspect, the present invention relates to a flat plate-shaped aluminum-diamond-based composite comprising an aluminum-diamond-based composite portion; and a surface layer containing a metal whose main component is aluminum, the surface layer covering both sides of the composite portion, wherein the composite portion comprises a matrix of aluminum or an aluminum alloy and diamond particles dispersed in the matrix;

wherein the diamond particles comprise 10 to 40% by volume of diamond particles each having a particle diameter of 1 μm or more and 20 μm or less, 50 to 80% by volume of diamond particles each having a particle diameter of 100 μm or more and 250 μm or less, and do not comprise diamond particles each having a particle diameter of less than 1 μm and diamond particles each having a particle diameter of more than 250 μm; and wherein the aluminum-diamond-based composite has an average value of in-plane thickness differences of 100 μm or less in a square of 50 mm×50 mm.

In one embodiment of the aluminum-diamond-based composite according to the present invention, the aluminum-diamond-based composite has a thermal conductivity at a temperature of 25° C. of 400 W/mK or more.

In another embodiment of the aluminum-diamond-based composite according to the present invention, the aluminum-diamond-based composite has a density of from 3.02 to 3.28 g/cm$^3$.

In yet another embodiment of the aluminum-diamond-based composite according to the present invention, the aluminum-diamond-based composite has an average thickness of from 0.48 to 2.2 mm.

In yet another aspect, the present invention relates to a heat dissipating member for a semiconductor element, comprising the aluminum-diamond-based composite according to the present invention.

Advantageous Effects of Invention

The aluminum-diamond-based composite according to the present invention is preferably used as a heat sink for dissipating heat of a semiconductor element, because the composite has high thermal conductivity and a coefficient of thermal expansion close to that of the semiconductor element and further has a small in-plane thickness difference between both surfaces.

BRIEF DESCRIPTION OF DRAWINGS

FIG. 1 is a cross-sectional view of an aluminum-diamond-based composite according to an embodiment of the present invention.

FIG. 2 is a cross-sectional view of a structured body before forming an aluminum-diamond-based composite according to one embodiment of the present invention.

FIG. 3 is a cross-sectional view of a structured body before forming an aluminum-diamond-based composite according to one embodiment of the present invention.

DESCRIPTION OF EMBODIMENTS

Embodiments of an aluminum-diamond-based composite according to the present invention and a method for producing the same will be described below with reference to the drawings.

In the following description, the number range "(from) . . . to . . . " means "more than or equal to" and "less than or equal to". For example, the number range "(from) A to B" means A or more and B or less. The wording "both surfaces" as used herein means both top and bottom principal surfaces of an aluminum-diamond-based composite formed in a flat plate shape.

As shown in FIG. 1, an aluminum-diamond-based composite 1 according to one embodiment of the present invention is a flat plate-shaped aluminum-diamond-based composite 1 containing diamond particles and a metal whose main component is aluminum. The aluminum-diamond-based composite 1 has a composite portion 2 and surface layers 3a and 3b provided on both surfaces of the composite portion 2. The composite portion 2 is comprised of a composite material made of a matrix of aluminum or an aluminum alloy and diamond particles dispersed in the matrix, and each of the surface layers 3a, 3b is made of a material containing a metal whose main component is aluminum. According to the aluminum-diamond-based composite having such a structure, stress is hardly generated between the surface layer 3 and the composite portion 2, and breakage of the surface layers 3 can be prevented when a force is applied by polishing or the like.

One of the features of the present invention is to use a diamond molded body obtained by molding a slurry containing diamond powder and an organic binder in the production of the aluminum-diamond-based composite.

The aluminum-diamond-based composite according to one embodiment of the present invention has high thermal conductivity and a coefficient of thermal expansion close to that of a semiconductor element, and further has a decreased thickness variation between both surfaces, and exhibits improved surface accuracy. More particularly, an average value of the in-plane thickness differences in 50 mm×50 mm may be 100 μm or less, and preferably 80 μm or less, and more preferably 60 μm or less, for example from 40 to 100 μm.

In terms of decreasing the thickness variation between both surfaces, the average thickness of the aluminum-diamond-based composite may preferably be 2.2 mm or less, and more preferably 2.0 mm or less, and even more preferably 1.8 mm or less. However, if the average thickness is too small, it will be difficult to form the composite. Therefore, the average thickness may preferably be 0.48 mm or more.

Hereinafter, with regard to the aluminum-diamond-based composite 1 according to one embodiment of the present invention, a method for producing it using a molten metal forging method will be described. However, the aluminum-diamond-based composite according to the present invention is not limited to that produced only by the molten metal forging method.

Here, methods for forming the aluminum-diamond-based composite are classified roughly into two types: an impregnation method and powder metallurgy. Among these, the impregnation method is often used for producing articles that are actually commercialized, in terms of characteristics such as thermal conductivity. There are also various methods in the impregnation method: a method of performing the impregnation at normal pressure and a high pressure forging method performed under high pressure. The high pressure forging method includes a molten metal forging method and a die casting method. A preferred method for producing the aluminum-diamond-based composite according to the present invention is the high pressure forging method in which impregnation is carried out under high pressure. In order to obtain a dense composite that is excellent in properties such as thermal conductivity, the molten metal forging method is preferable. The molten metal forging method generally refers to a method including charging powder or a molded body of diamond or the like in a high pressure vessel and impregnating it with a molten metal such as an aluminum alloy under a high temperature and a high pressure to obtain a composite.

[Diamond Powder]

For diamond powder which is a raw material of the aluminum-diamond-based composite, natural diamond powder and/or artificial diamond powder can be used.

For the particle size of the diamond powder, it is preferable to include diamond particles each having a particle diameter of 1 μm or more and 20 μm or less, and diamond particles each having a particle diameter of 100 μm or more and 250 μm or less, in view of thermal conductivity. The diamond particles each having a particle size of from 1 to 20 μm may preferably be from 10 to 40% by volume, and more preferably from 20 to 30% by volume, based on all the diamond particles. The diamond particles each having a particle diameter of from 100 to 250 μm may preferably be from 50 to 80% by volume, and more preferably 60 to 70% by volume, based on all the diamond particles.

On the other hand, it is preferable that the diamond particles each having a particle diameter of less than 1 μm and the diamond particles each having a particle diameter of more than 250 μm are not present for the reason of obtaining improved thermal conductivity. It is more preferable that the diamond particles each having a particle diameter of less than 10 μm and the diamond particles each having a particle diameter of more than 200 μm are not present. It should be noted that the "not present" as used herein means that those particles are not substantially present, but it is permissible that those particles may inevitably mix within a range that does not affect the characteristics. For example, it means that the total of diamond particles each having a particle diameter of less than 1 μm and diamond particles each having a particle diameter of more than 250 μm is 1% by volume or less, and preferably 0.5% by volume or less, and more preferably 0.1% by volume or less, and still more preferably 0.01% by volume or less. In a preferred embodiment, the total of the diamond particles each having a particle diameter of less than 10 μm and the diamond particles each having a particle diameter of more than 200 μm is 1% by volume or less, and preferably 0.5% by volume or less, and even more preferably 0.1% by volume or less, and still more preferably 0.01% by volume or less.

In order to increase a filling amount of the diamond powder, the diamond particles each having a particle diameter of from 10 to 20 μm may preferably be from 10 to 40% by volume, and more preferably from 20 to 30% by volume, based on all the diamond particles. In a preferred embodiment of the present invention, the diamond particles each having a particle diameter of from 150 to 200 μm may preferably be from 50 to 80% by volume, and more preferably from 60 to 70% by volume, based on all the diamond particles. The particle size distribution measurement is carried out by using a commonly used laser diffraction/scattering method or the like.

The content of the diamond particles in the aluminum-diamond-based composite may preferably be 40% by volume or more and 70% by volume or less, and more preferably 60% by volume or more and 70% by volume or less. The content of the diamond particles of 60% by volume or more can sufficiently ensure the thermal conductivity of the resulting aluminum-diamond-based composite. From the viewpoint of a filling property, the content of the diamond particles may preferably be 70% by volume or less. The content of the diamond particles of 70% by volume or less eliminates a need for processing the diamond particles into a certain shape such as spherical shape, and allows the aluminum-diamond-based composite to be obtained at a stable cost.

In the composite obtained by the molten metal forging method, the molten metal permeates the gaps between the powders under appropriate conditions, so that the ratio of the volume of the powder to the filling volume is roughly equal to the volume of the powder material (the content of the particles) relative to the volume of the entire composite obtained. The difference may be about 0.5 to 2%, depending on the thickness of the composite.

Furthermore, by using diamond powder in which a layer of δ-type silicon carbide is formed on the surfaces of the diamond particles, generation of metal carbide ($Al_4O_3$) having low thermal conductivity formed during the forming of the composite can be suppressed, and wettability to the molten aluminum can be improved. As a result, it is possible to obtain an effect of improving the thermal conductivity of the resulting aluminum-diamond-based composite. The layer of β-type silicon carbide can be formed by heating the diamond particles together with silicon and silicon oxide powder in an inert gas atmosphere such as argon.

[Organic Binder]

Further, the diamond powder can be molded by adding an organic binder and a solvent to the diamond particles to form a slurry. By preparing a diamond molded body using a method described below, thickness variations of the diamond molded body and the aluminum-diamond-based composite can be reduced. The organic binder used in the preparation of the diamond molded body is not limited as long as the organic binder does not react with the diamond powder or other additives and has no residual ash after thermal decomposition. Examples of the organic binder include at least one resin selected from acrylic resins, cellulose resins, polyvinyl alcohol resins, polyvinyl acetal resins, urethane resins, and vinyl acetate resin. In terms of easy handling of a solvent and a cost, a water soluble binder may be more preferably used. Further, it is possible to use a plurality of organic binders as long as the dispersion state of the slurry is not impaired.

The organic binder can be removed from the diamond molded body by subjecting the molded body to a heat treatment at a temperature higher than or equal to the decomposition temperature of the organic binder. If an amount of the organic binder to be added is less than 0.5 parts by mass, based on 100 parts by mass of the diamond powder, the strength of the resulting diamond molded body is decreased and the molded body is readily deformed during handling or processing in the subsequent steps, so that unwanted thickness variations are increased. Therefore, the amount of the organic binder to be added may preferably be 0.5 parts by mass or more, and more preferably 0.8 parts by mass or more, and even more preferably 1.0 part by mass or more, based on 100 parts by mass of the diamond powder. On the other hand, if the amount of the organic binder to be added is more than 20 parts by mass based on 100 parts by mass of the diamond powder, the thickness of the molded body should be increased in order to obtain the density required for the aluminum-diamond-based composite. However, the increase in the thickness of the molded body is not preferable because it results in larger volumetric change of the molded body before and after decomposition of the organic binder in the heat treatment and leads to increased thickness variations. Therefore, the amount of the organic binder to be added may preferably be 20 parts by mass or less, and more preferably 18 parts by mass or less, and still more preferably 16 parts by mass or less, based on 100 parts by mass of the diamond powder.

[Solvent]

For the solvent, both aqueous and non-aqueous solvents can be used as long as they dissolve the organic binder and disperse the diamond powder. Water is preferably used in terms of convenience of handling of the solvent and costs. Examples of the non-aqueous solvent include an alcohol solvent such as methanol, ethanol, propanol, and butanol; a ketone solvent such as methyl ethyl ketone and acetone; an aromatic hydrocarbon solvent such as benzene, toluene, and xylene; an ester solvent such as ethyl acetate and butyl acetate; an ether solvent such as tetrahydrofuran and dioxane; an amide solvent such as N,N-dimethylformamide; and mixtures thereof. If the amount of the solvent to be added is less than 10 parts by mass based on 100 parts by mass of the diamond powder, the organic binder remains undissolved and handling and workability are deteriorated. Therefore, the amount of the solvent to be added may preferably be 10 parts by mass or more, and more preferably 11 parts by mass or more, and still more preferably 12 parts by mass or more, based on 100 parts by mass of the diamond powder. On the other hand, if the amount of the solvent to be added is more than 60 parts by mass based on the diamond powder, the viscosity of the slurry will be excessively decreased and it will be difficult to process the molded body. Accordingly, the amount of the solvent to be added may preferably be 60 parts by mass or less, and more preferably 55 parts by mass or less, and still more preferably 50 parts by mass or less, based on 100 parts by mass of the diamond powder.

[Other Additives]

The diamond molded body used in the present invention may contain additives such as a plasticizer and a dispersant as necessary.

Examples of the plasticizer include a phthalate ester plasticizer such as dioctyl phthalate and diisononyl phthalate; an ethylene glycol plasticizer such as polyethylene glycol. One or more of these plasticizers may be used.

Examples of the dispersant include cationic surfactants such as a quaternary ammonium salt and nonionic surfactants such as a polyethylene glycol surfactant. One or more of these dispersants may be used.

[Preparation of Diamond Molded Body]

First, the diamond molded body for preparing the aluminum-diamond-based composite according to one embodiment of the present invention can be prepared as follows. The organic binder, the solvent and the like are added to the diamond powder that is the raw material powder of the diamond molded body to prepare a slurry. The slurry is molded by a known molding method such as a doctor blading method, a press method, an extrusion molding method, a casting method and the like to form a diamond molded body having a predetermined thickness.

The diamond molded body molded using the slurry may have an average value of in-plane thickness differences of 100 µm or less, and preferably 80 µm or less, and more preferably 60 µm or less, for example from 40 to 100 µm, in which the in-plane thickness difference represents a difference between the maximum value and the minimum value when measuring the thicknesses at arbitrary 9 positions in the plane based on a square of 50 mm×50 mm, and the in-plane thickness differences are determined multiple times to obtain the average value. Thus, the preparation of the aluminum-diamond-based composite using the diamond molded body having high uniform in-plane thickness can reduce the in-plane thickness difference in 50 µm×50 mm of the composite to 100 µm or less.

In terms of reducing the thickness variation between both surfaces of the aluminum-diamond-based composite finally obtained, the average thickness of the diamond molded body may preferably be 2.2 mm or less, and more preferably 2.0 mm or less, and even more preferably 1.8 mm or less. However, if the average thickness is too small, it will be difficult to form the composite body. Therefore, the average thickness may preferably be 0.48 mm or more.

The diamond molded body is dried, then placed in a mold member and then heated at a temperature higher than or equal to the decomposition temperature of the organic binder in an air atmosphere or a nitrogen atmosphere to remove the organic binder. The diamond molded body returns to the powder state by heating the molded body after being placed in the mold member, so that it is difficult to maintain the shape of the diamond molded body and the thickness variation is increased unless it is placed in the mold member. However, if the molded body is heated at 800° C. or higher, the oxidation of diamond will progress and the thermal conductivity of the composite will be decreased. Therefore, the heating temperature may preferably be 800° C. or lower. The heating may be preferably carried out in an air atmosphere or a nitrogen atmosphere, in terms of costs, but an inert gas atmosphere such as argon causes no problem of characteristics. The heating time depends on the size of the molded body, for example it may be from about 1 to 3 hours.

The heated diamond molded body has space where the organic binder has been present. Therefore, when diamond is directly impregnated with the aluminum alloy, the diamond content of the resulting aluminum-diamond-based composite will be decreased and the thermal conductivity of the composite will be lowered. Therefore, the diamond molded body should be compressed by press working or the like to increase the density of the molded body. The working pressure may preferably be 0.5 MPa or more, and more preferably 0.6 MPa or more, in order to increase the diamond content in the composite after impregnation with the aluminum alloy. Further, the working pressure may preferably be 2 MPa or less, and more preferably 1.8 MPa or less, in order to prevent deformation and destruction of the mold member.

[Molten Metal Forging Method]

For preparation of molten metal forging, a mold member (4a and 4b in FIGS. 2 and 3), aluminum foils or aluminum alloy foils (8a and 8b in FIGS. 2 and 3), dense release plates coated with a mold releasing agent (5a and 5b in FIGS. 2 and 3) and a diamond molded body (6 in FIGS. 2 and 3) can be arranged as shown in FIGS. 2 and 3 to form a structured body for molten metal forging, which is comprised of the mold member 4 (4a, 4b), the aluminum foils or aluminum alloy foils 8 (8a, 8b), the mold release plates 5 (5a, 5b) and the filled diamond molded body 6. Here, FIGS. 2 and 3 are cross-sectional views of the structured body for molten metal forging, and are cross-sectional views of a portion filled with the diamond molded body. When forming a composite from the aluminum alloy and the diamond molded body by the molten metal forging method, the aluminum alloy reaches the diamond molded body filled portion through the porous mold member. The shape, characteristics and the like of the resulting aluminum-diamond-based composite do not vary depending on arrangement methods. Therefore, FIG. 2 will be described below as a representative example of the arrangement method.

[Aluminum Alloy]

Aluminum or the aluminum alloy (a metal containing aluminum) in the aluminum-diamond-based composite according to an embodiment of the present invention preferably has a melting point as low as possible in order to sufficiently permeate into gaps (between diamond particles) of the diamond powder during impregnation, for example it may preferably have a melting point of from 570 to 660° C. Examples of the aluminum alloy include an aluminum alloy containing from 5 to 25% by mass of silicon. The use of the aluminum alloy containing from 5 to 25% by mass of silicon can provide an effect of promoting the densification of the aluminum-diamond-based composite.

Further, the diamond particles can be tightly bonded to the metal moiety by containing magnesium in the aluminum alloy, which is preferable. The content of magnesium in the aluminum alloy may be, for example, 5% by mass or less, and preferably from 0.5 to 2% by mass. The metal components other than aluminum, silicon and magnesium in the aluminum alloy are not particularly limited as long as they do not change the characteristics of the aluminum alloy, and copper or the like may be contained, for example. An exemplary composition of the aluminum alloy includes a composition containing from 5 to 25% by mass of silicon and from 0 to 5% by mass of magnesium, the balance being aluminum and unavoidable impurities.

[Mold Member]

The material of the mold member 4 that can be impregnated with aluminum or the aluminum alloy by the molten metal forging method are not particularly limited as long as it has a shape or a porous material that can be impregnated with the aluminum alloy by the molten metal forging method. However, the mold member may be preferably made of a material such as graphite, boron nitride, alumina fibers or the like which have good heat resistance and can allow stable supply of the molten metal.

[Mold Release Plate]

Further, examples of the dense mold release plates 5 that can be used include stainless steel plates or ceramics plates, and the dense mold release plates 5 are not particularly limited as long as each mold release plate is a dense body which is not impregnated with aluminum or the aluminum alloy by the molten metal forging method. The mold releasing agent to be applied to the mold release plates include a mold releasing agent such as graphite, boron nitride or alumina which has good heat resistance, which is used alone or in combination thereof. Further, mold release plates that can carry out more stable mold release can be obtained by applying the mold releasing agent after coating the surfaces of the mold release plates with alumina sol or the like.

One embodiment of the present invention is characterized by removing the mold release plates 5 disposed on both sides of the composite after forming the composite by impregnation. With such a unique configuration, an aluminum-diamond-based composite having a very smooth surface can be obtained.

As shown in FIG. 2, metal plates (7 in FIG. 2) may be disposed on both sides of the structured body. When multiple structured bodies are stacked to form a block, the structured bodies may be stacked via the metal plate(s) 7. The disposing of such a metal plate 7 allows uniform impregnation with the molten metal, and allows easy operation such as retrieval of the aluminum-diamond-based composite after the impregnation treatment.

One or more of the resulting structured bodies are stacked to form a block(s), which can be heated at a temperature of from about 600 to 750° C. One or more blocks are placed in a high pressure container, and a molten aluminum alloy heated at a temperature higher than or equal to the melting point of the alloy can be supplied as soon as possible to pressurize the molten metal at a pressure of 20 MPa or more, thereby forming a composite and molding of diamond and aluminum alloy.

Here, when the heating temperature of the block is 600° C. or higher, the composite of the aluminum alloy and the diamond particles will be stabilized, and an aluminum-diamond-based composite having sufficient thermal conductivity can be obtained. Further, when the heating temperature is 750° C. or less, the formation of aluminum carbide ($Al_4O_3$) on the surface of the diamond powder can be suppressed during the forming of the composite with the aluminum alloy, and an aluminum-diamond-based composite having sufficient thermal conductivity can be obtained.

For the pressure during the impregnation, the pressure of 20 MPa or more can lead to stable composite of the aluminum alloy and can provide an aluminum-diamondbased composite having sufficient thermal conductivity. More preferably, the pressure during the impregnation may be 50 MPa or more. If it is 50 MPa or more, an aluminum-diamond-based composite having more stable thermal conductivity characteristics can be obtained.

[Annealing Treatment]

The aluminum-diamond-based composite base material obtained by the above operation may be subjected to an annealing treatment. By performing the annealing treatment, strain in the aluminum-diamond-based composite is removed and an aluminum-diamond-based composite having more stable thermal conductivity characteristics can be obtained.

In order to remove only the strain in the molded body without affecting the surface of the resulting aluminum-diamond-based composite base material, the annealing treatment is preferably carried out at a temperature of from 400° C. to 550° C. for 10 minutes or more.

[Processing Method]

Further, the side surface of the aluminum-diamond-based composite base material obtained by the above operation can be processed into a predetermined shape to form an aluminum-diamond-based composite. Furthermore, in order to fix the aluminum-diamond-based composite to other dissipating member by screwing, the aluminum-diamond-based composite base material may be processed so as to penetrate the top and bottom surfaces of the flat plate-shaped aluminum-diamond-based composite to provide a hole(s). The above aluminum-diamond-based composite base material is a very hard, difficult-processing material. Therefore, although it is possible to process the composite by means of ordinary machining and grinding using a diamond tool, water jet processing or laser processing may be preferable from the viewpoint of durability of the tool and processing cost.

[Surface Layer]

When the aluminum-diamond-based composite according to the present invention is used as a heat sink for semiconductor elements, it is desirable that surface layers 3 each made of a material including a metal containing aluminum are present on both surfaces of the composite. The surface layers can provide effects of improving the adhesion when plating the both surfaces of the composite and of improving the surface roughness of both surfaces of the composite.

Here, each surface layer 3 is mainly composed of the material containing the metal containing aluminum, but it may contain a substance(s) other than the metal containing aluminum. That is, it may contain the diamond particles and other impurities.

However, it is preferable that the diamond particles are not present in a portion of 0.01 mm from the surface of each surface layer 3. With such a configuration, a processing method adopted for ordinary metal processing can be employed, and each layer 3 can be made smooth without damaging on the polished surface.

Further, each surface layer 3 may preferably contain 80% by volume or more of the metal containing aluminum. The content of the metal containing aluminum of 80% by volume or more can allows the processing method adopted for ordinary metal working to be employed to polish each surface layer 3. Further, the content of the metal containing aluminum may more preferably be 90% by volume or more. When the content of the metal containing aluminum is 90% by volume or more, damage of polished surface caused by release of internal impurities and the like can be eliminated during polishing of the surface. The content of aluminum in the metal containing aluminum may preferably be 75% by mass or more and 100% by mass or less, and more preferably 80% by mass or more and 100% by mass or less, and still more preferably 85% by mass or more and 100% by mass or less, for the purpose of improving the adhesion when subjecting both surfaces of the composite to the plating treatment.

For the thickness of each surface layer, it is preferable that the average thickness is 10 μm or more. When the average thickness is 10 μm or more, the diamond particles are not exposed to the surface of the composite in the subsequent treatment, and target surface accuracy and the adhesion of the plating layer can be ensured. Further, it is preferable that the total of the average thickness of each of the both surface layers 3 is 20% or less of the thickness of the aluminum-diamond-based composite 1. The total of the average thickness of each of the both surface layers of 20% or less of the thickness of the composite can lead to an aluminum-diamond-based composite having sufficient thermal conductivity in addition to the surface accuracy and the adhesion of the plating layer.

Each surface layer 3 can be introduced, for example by forming a composite with the aluminum alloy while disposing the aluminum foil or ceramic fibers such as alumina fibers between the diamond molded body and the dense mold release plate coated with the mold releasing agent upon filling the diamond molded body, or by thermal spraying of aluminum or the like to the surface after obtaining the composite.

[Surface Metal Layer]

When the aluminum-diamond-based composite according to one embodiment of the present invention is used as a heat sink for a semiconductor element, the composite is often bonded to the semiconductor element by brazing. Therefore, it is preferable to provide a surface metal layer on the bonding surface of the aluminum-diamond-based composite to the semiconductor element. Examples of a method of forming the surface metal layer that can be adopted include methods such as a plating method, a thermal spraying method, a sputtering method and the like. From the viewpoint of processing cost, the plating treatment is preferable. The surface metal layer may be provided on the entire surface of the aluminum-diamond-based composite or may be provided on a part of the surface. A preferred example of the plating process will be described below.

First, crystalline Ni plating having a film thickness of from 1 to 10 μm is applied to the metal containing aluminum forming the surface layer 3 of the aluminum-diamond-based composite. The plating method is preferably Ni electroplating, but Ni electroless plating or a combination of Ni electroplating and Ni electroless plating may be applied as long as the crystalline Ni plating film can be obtained. The Ni plating may be Ni alloy plating containing from 5 to 15% by weight of phosphorus (P). If the thickness of the Ni plating film is less than 1 μm, unwanted pinholes (portions where plating is not coated) of the plating film will be generated. If the thickness of the Ni plating film is more than 10 μm, residual stress generated in the plating film will be increased, which will cause unwanted blistering, peeling or cracking of the plated film due to a temperature load during actual use, in applications such as the present embodiment.

For the adhesion of the Ni plating, the peel strength may preferably be 50 N/cm or more, and more preferably 78 N/cm or more. If the peel strength is less than 50 N/cm, unwanted peeling of the plated layer may be generated due to a temperature load during actual use, when the composite is used as a heat dissipating component for the semiconductor element.

When the composite is joined by a brazing filler metal at an elevated temperature, Au plating having a thickness of from 0.03 to 4 μm is preferably applied onto the outermost surface by an electroplating treatment or an electroless plating treatment. If the thickness of the plated film is less than 0.03 μm, the joining will not be sufficient, which is not preferable. For the upper limit, there is no restriction in view of characteristics. However, since the Au plating is very expensive, the thickness may preferably be 4 μm or less.

Further, the aluminum-diamond-based composite according to an embodiment of the present invention has a thermal conductivity of 400 W/mK or more when the temperature of the aluminum-diamond-based composite is 25° C., and has a coefficient of thermal expansion from 25° C. to 150° C. of from $4×10^{-6}$/K to $10×10^{-6}$/K.

The thermal conductivity at 25° C. of 400 W/mK or more and the coefficient of thermal expansion from 25° C. to 150° C. of $4×10^{-6}$/K to $10×10^{-6}$/K may result in a high thermal conductivity and a low coefficient of thermal expansion that is an equivalent level to that of the semiconductor element. Therefore, when the composite is used as a heat dissipating component such as a heat sink, the composite can suppress breakage of the semiconductor element because it has excellent heat dissipation characteristics and there is small difference in coefficient of thermal expansion between the semiconductor element and the heat dissipating component even if they are subjected to a temperature change. As a result, the composite is preferably used as a highly reliable heat dissipating component.

[Semiconductor Element]

The heat dissipating component of the aluminum-diamond-based composite according to one embodiment of the present invention has a high thermal conductivity and a low coefficient of thermal expansion that is an equivalent level to that of the semiconductor element, and is suitable as a heat dissipating component for semiconductor laser elements requiring high power, such as GaN, GaAs and SiC, or as a heat dissipating component for high frequency elements. In particular, it is suitable as a heat dissipating component for a GaN-HEMT element and a GaAs-HEMT element which are the high frequency elements.

While the aluminum-diamond-based composite according to the present invention, the heat dissipating component using the same, and the method for producing the same have been described with reference to the embodiments, the present invention is not limited those embodiments.

EXAMPLES

Hereinafter, the present invention will be described in more detail with reference to Examples, but the present invention is not limited thereto.

Examples 1 to 8, Comparative Examples 1 to 10

Commercially available diamond was classified to obtain diamond powder A (a particle diameter of more than 250 μm), diamond powder B (a particle diameter of 100 μm or more and 250 μm or less), diamond powder C (a particle diameter of more than 20 μm and less than 100 μm), diamond powder D (a particle diameter of 1 μm or more and 20 μm or less), and diamond powder E (a particle diameter of less than 1 μm). These diamond powders were mixed in the formulation as shown in Table 1. The particle diameter of each diamond powder was measured by a particle size distribution measuring apparatus (LS 230 from Beckman Coulter) using a laser diffraction/scattering method. To 100 parts by mass of the mixed diamond powder were added hydroxymethyl propyl cellulose as an organic binder and water as a solvent in amounts as shown in Table 1, and they were mixed for 10 minutes in a small stirring mixer to prepare a slurry. In Comparative Example 1, an aluminum-diamond-based composite was produced by directly placing the diamond powder in a graphite mold member as described below, without adding any organic binder and any solvent.

The resulting slurry was molded by a press machine at a pressure of 10 MPa, dried at 90° C. for 3 hours, and then cut by punching to prepare a flat plate-shaped diamond molded body having a length of 75 mm×a width of 75 mm×a thickness of 1.5 mm. At this stage, the in-plane thickness was measured by a micrometer at arbitrary nine positions in an arbitrary square area of a length of 50 mm×a width of 50 mm, and this measurement was repeated five times to determine in-plane thickness differences (maximum thickness−minimum thickness). An average value of the determined in-plane thickness differences is shown in Table 1.

Subsequently, the resulting molded body was placed in a graphite mold member having an external shape of 100 mm×100 mm×5 mm, in which a rectangular hole having a size of 75 mm×75 mm×5 mm was formed on the inner side. More particularly, two stainless steel sheets (SUS 304) each having 75 mm×75 mm×2 mmt were prepared by coating them with alumina sol and baked at 300° C. for 1 hour, and then coating them with a graphite-based mold releasing agent, and aluminum foils each having 75 mm×75 mm×0.01 mm was placed on both surfaces of the diamond molded body, and the diamond molded body was filled in the hole of the mold member such that the aluminum foils placed on both surfaces of the molded body were sandwiched between the stainless steel sheets to produce a structured body.

The structured body was subjected to a heat treatment in an electric furnace at a temperature of 500° C. for 2 hours to decompose hydroxymethyl propyl cellulose. The structured body after the heat treatment was pressed together with the stainless steel sheets sandwiching both surfaces of the molded body by a pressing machine at 1 MPa.

A plurality of structured bodies was stacked while sandwiching the structured body between the stainless steel sheets having 100×100×1 mmt coated with the graphite-based mold releasing agent, and iron sheets each having a thickness of 12 mm were disposed on both top and bottom sides of the stack, and the iron sheets were connected by six M10 bolts and tightened by a torque wrench such that a tightening torque in the plane direction was 10 Nm, to form one block.

The block was preheated in an electric furnace at 620° C. and then placed in a press mold having an inner diameter of 300 mm which had been preheated. A molten aluminum alloy at a temperature of 800° C., which contained 12% of silicon and 1% of magnesium, the balance being aluminum and inevitable impurities, was poured in the mold, and pressurized at a pressure of 100 MPa for 20 minutes to impregnate the diamond powder with the aluminum alloy. After cooling to room temperature, cutting was carried out along the side surface shape of the mold release plates by a wet band saw, and the sandwiching stainless steel sheets was removed to obtain aluminum-diamond-based composite base materials. Each of these aluminum-diamond-based composite base materials was processed to have an external shape of 50 mm×50 mm by laser processing to obtain an aluminum-diamond-based composite. The in-plane thicknesses at arbitrary nine positions of each composite were measured five times by means of a micrometer to determine an average value of the thicknesses and an average value of the in-plane thickness differences (maximum thickness–minimum thickness). Also, the density of the composite was measured by the Archimedes method and the diamond content was calculated using a complex rule (diamond density: 3.52 g/cm$^3$, aluminum alloy density: 2.7 g/cm$^3$). The results are shown in Table 2. Further, the produced aluminum-diamond-based composite was cut by means of water jet processing, the cross section was observed with an industrial microscope, the thicknesses at arbitrary five positions of two surface layers were measured, and the average value was then confirmed. As a result, a region (surface layer) in which no diamond particles were present was confirmed in a region of 0.01 mm in the depth direction from the surface for both the top and bottom surfaces of the aluminum-diamond-based composite. Further, analysis by means of an energy dispersive X-ray analyzer demonstrated that the region was composed of the metal whose main component was aluminum.

Further, a test sample having 25 mm×25 mm×2 mmt for measuring thermal conductivity was prepared by laser processing. Using the test sample, the thermal conductivity at 25° C. was measured by a laser flash method (LF/TCM-8510B from Rigaku Corporation). Furthermore, a test sample for measuring a coefficient of thermal expansion (3×2×10 mm) was prepared by subjecting the resulting aluminum-diamond-based composite base material to water jet processing, and the coefficient of thermal expansion at a temperature of from 25 to 150° C. was measured by a thermal expansion meter. The results are shown in Table 2.

As shown in Table 2, each of the aluminum-diamond-based composites according to Examples 1 to 8 had an average value of the in-plane thickness differences of as small as from 0.050 to 0.069 mm and a high thermal conductivity.

On the contrary, in the aluminum-diamond-based composite of Comparative Example 1, the average value of the in-plane thickness differences was more than 100 μm, because the diamond powder was filled in the form of powder into the frame without mixing it with the organic binder and the solvent.

In the aluminum-diamond-based composites according to Comparative Examples 2 to 5, the desired thermal conductivity could not be obtained, because as shown in Table 1, the composite of Comparative Example 2 included more than 40% by volume of diamond particles each having a particle diameter of 1 μm or more and 20 μm or less, and the composite of Comparative Example 3 included less than 50% by volume of diamond particles each having a particle diameter of 100 μm or more and 250 μm or less, and the composite of Comparative Example 4 included diamond particles each having a particle diameter of more than 250 μm, and the composite of Comparative Example 5 included diamond particles each having a particle diameter of less than 1 μm.

In Comparative Examples 6 to 8, chipping occurred during processing and handling, and a desired handling property was not exhibited, because as shown in Table 1, the composite of Comparative Example 6 included less than 10% by volume of particles each having a particle diameter of 1 μm or more and 20 μm or less, and the composite of Comparative Example 7 included more than 80% by volume of particles each having a particle diameter of 100 μm or more and 250 μm or less, and the composite of Comparative Example 8 had an added amount of the organic binder of less than 0.5 parts by mass based on 100 parts by mass of the diamond particles.

Further, in Comparative Example 9, the average value of the in-plane thickness differences of the produced aluminum-diamond-based composite was more than 100 μm, because an added amount of the organic binder was more than 20 parts by mass based on 100 parts by mass of the diamond particles.

In Comparative Examples 10 and 11, it was difficult to mold each diamond molded body, because an added amount of the solvent was less than 10 parts by mass for Comparative Examples 10 and more than 60 parts by mass for Comparative Example 11, based on 100 parts by mass of the diamond powder.

Examples 9 to 13, Comparative Examples 12 to 13

High purity diamond powders were mixed to obtain the same particle size distribution as that of Example 1. To 100 parts by mass of the powder mixture were added 5 parts by mass of hydroxylmethyl propyl cellulose as an organic binder and 15 parts by mass of water as a solvent, and they were mixed for 10 minutes by means of a small stirring mixer to obtain a slurry.

The resulting slurry was molded into the target thickness by the method as shown in Table 3, dried at 90° C. for 3 hours, and then cut by punching to prepare a flat plate-shaped diamond molded body having a length of 75 mm×a width of 75 mm. At this stage, the in-plane thickness was measured by an micrometer at arbitrary nine positions in an arbitrary square area of a length of 50 mm×a width of 50 mm, and this measurement was repeated five times to determine in-plane thickness differences (maximum thickness–minimum thickness). An average value of the determined in-plane thickness differences is shown in Table 3.

Subsequently, the resulting molded body was impregnated with an aluminum alloy in the same method as that of Example 1 to produce an aluminum-diamond-based composite base material. The resulting composite base material was processed into an external shape of 50 mm×50 mm by water jet processing to obtain an aluminum-diamond-based composite. The average value of the In-plane thicknesses and the average value of the in-plane thickness differences (maximum thickness–minimum thickness) at arbitrary 9 positions, the density of the composite, the diamond content, the thermal conductivity and the coefficient of thermal expansion of the composite were measured for each of the resulting aluminum-diamond-based composites in the same methods as those of Example 1. The results are shown in Table 4.

In the aluminum-diamond-based composite of Comparative Example 12, the average value of the in-plane thickness differences was more than 100 μm, because the average thickness of the diamond molded body was more than 2.2 mm. In Comparative Example 13, chipping and breakage occurred during processing and handling of the resulting aluminum-diamond-based composite, so that the handling property was poor, because the average thickness of the diamond molded body was less than 0.48 mm.

Example 14

High purity diamond powders were mixed to obtain the same particle size distribution as that of Example 1. To 100 parts by mass of the powder mixture were added 18 parts by mass of butyral as an organic binder and 60 parts by mass of a solution obtained by mixing toluene, methyl ethyl ketone, acetone and methanol in a volume mixing ratio of 3:3:1:1 as a solvent, and they were mixed in a small stirring mixer for 10 minutes to prepare a slurry.

The resulting slurry was degassed, molded in a press machine, dried and cut to produce a diamond molded body having a length of 50 mm, a width of 50 mm and a thickness of 1.5 mm. At this stage, the in-plane thickness was measured five times by a micrometer at arbitrary nine positions to determine in-plane thickness differences. An average value of the in-plane thickness differences was 0.027 mm.

Subsequently, the resulting molded body was impregnated with an aluminum alloy in the same method as that of Example 1 to produce an aluminum-diamond-based composite base material. The resulting composite base material was processed into an external shape of 50 mm×50 mm by laser processing to obtain an aluminum-diamond-based composite. The average value of the In-plane thicknesses and the average value of the in-plane thickness differences (maximum thickness−minimum thickness) at arbitrary 9 positions, the density, thermal conductivity and coefficient of thermal expansion of the composite were measured for each of the resulting aluminum-diamond-based composites, in the same methods as those of Example 1. As a result, the in-plane thickness variation was 0.081 mm, the density was 3.220 g/cm$^3$, the diamond content was 63% by volume, the thermal conductivity at 25° C. was 510 W/mK, and the coefficient of thermal expansion at a temperature of from 25 to 150° C. was $7.0 \times 10^{-6}$/K.

Example 15

To 5 parts by mass of hydroxymethyl propyl cellulose as an organic binder and 15 parts by mass of water as a solvent were added 100 parts by mass of diamond particles composed of 20% by volume of high purity diamond powder having a particle diameter of 10 μm or more and 20 μm or less and 70% by volume of high purity diamond powder having a particle diameter of 150 μm or more and 200 μm or less, the balance being diamond powder having a particle diameter of more than 20 μm and less than 150 μm, and they were mixed in a small stirring mixer for 10 minutes to prepare a slurry.

The resulting slurry was molded in the same procedure as that of Example 1 to produce a flat plate-shaped diamond molded body having a length of 75 mm, a width of 75 mm and a thickness of 1.5 mm. At this stage, the in-plane thickness was measured five times by a micrometer at arbitrary nine positions in an arbitrary square area of a length of 50 mm×a width of 50 mm to determine in-plane thickness differences. An average value of the in-plane thickness differences was 0.023 mm.

Subsequently, the resulting molded body was impregnated with an aluminum alloy in the same method as that of Example 1 to produce an aluminum-diamond-based composite base material. The resulting composite base material was processed into an external shape of 50 mm×50 mm by laser processing to obtain an aluminum-diamond-based composite. The average value of the In-plane thicknesses and the average value of the in-plane thickness differences (maximum thickness−minimum thickness) at arbitrary 9 positions, the density, thermal conductivity and coefficient of thermal expansion of the composite were measured for each of the resulting aluminum-diamond-based composites in the same methods as those of Example 1. As a result, the average value of the in-plane thicknesses differences was 0.049 mm, the density was 3.223 g/cm$^3$, the diamond content was 63% by volume, the thermal conductivity at 25° C. was 550 W/mK, and the coefficient of thermal expansion at a temperature of from 7 to 25° C. was $7.0 \times 10^{-6}$/K.

TABLE 1

| Type | Diamond Particle Diameter (% by volume) | | | | | Amount of Binder (parts by mass) | Amount of Solvent (Parts by mass) | Diamond Molded Body Average In-plane Thickness Difference (mm) |
| --- | --- | --- | --- | --- | --- | --- | --- | --- |
| | A | B | C | D | E | | | |
| Example 1 | 0 | 65 | 10 | 25 | 0 | 5.0 | 15 | 0.021 |
| Example 2 | 0 | 80 | 10 | 10 | 0 | 5.0 | 15 | 0.016 |
| Example 3 | 0 | 65 | 25 | 10 | 0 | 5.0 | 15 | 0.022 |
| Example 4 | 0 | 50 | 25 | 25 | 0 | 5.0 | 15 | 0.017 |
| Example 5 | 0 | 50 | 10 | 40 | 0 | 5.0 | 15 | 0.024 |
| Example 6 | 0 | 50 | 40 | 10 | 0 | 5.0 | 15 | 0.020 |
| Example 7 | 0 | 65 | 10 | 25 | 0 | 0.5 | 15 | 0.031 |
| Example 8 | 0 | 65 | 10 | 25 | 0 | 20 | 15 | 0.028 |
| Comparative Example 1 | 0 | 65 | 10 | 25 | 0 | 0 | 0 | — |
| Comparative Example 2 | 0 | 50 | 5 | 45 | 0 | 5.0 | 15 | 0.023 |
| Comparative Example 3 | 0 | 45 | 15 | 40 | 0 | 5.0 | 15 | 0.029 |
| Comparative Example 4 | 5 | 65 | 5 | 25 | 0 | 5.0 | 15 | 0.031 |
| Comparative Example 5 | 0 | 65 | 5 | 25 | 5 | 5.0 | 15 | 0.030 |
| Comparative Example 6 | 0 | 65 | 30 | 5 | 0 | 5.0 | 15 | — |
| Comparative Example 7 | 0 | 85 | 5 | 10 | 0 | 5.0 | 15 | — |
| Comparative Example 8 | 0 | 65 | 10 | 25 | 0 | 0.4 | 15 | — |
| Comparative Example 9 | 0 | 65 | 10 | 25 | 0 | 25 | 15 | 0.032 |
| Comparative Example 10 | 0 | 65 | 10 | 25 | 0 | 5.0 | 5 | — |
| Comparative Example 11 | 0 | 65 | 10 | 25 | 0 | 5.0 | 65 | — |

TABLE 2

| Type | Composite Average Thickness (mm) | Composite Average In-plane Thickness Difference (mm) | Density (g/cm$^3$) | Diamond Content (% by volume) | Shape Retention | Thermal Conductivity (W/mK) | Coefficient of Thermal Expansion (×10$^6$/K, from 25° C. to 150° C.) |
|---|---|---|---|---|---|---|---|
| Example 1 | 1.501 | 0.061 | 3.225 | 64 | Good | 540 | 7.0 |
| Example 2 | 1.500 | 0.050 | 3.208 | 62 | Good | 500 | 7.2 |
| Example 3 | 1.503 | 0.065 | 3.200 | 61 | Good | 490 | 7.2 |
| Example 4 | 1.497 | 0.051 | 3.252 | 67 | Good | 530 | 6.7 |
| Example 5 | 1.505 | 0.060 | 3.249 | 67 | Good | 540 | 6.7 |
| Example 6 | 1.498 | 0.057 | 3.233 | 65 | Good | 510 | 6.9 |
| Example 7 | 1.499 | 0.052 | 3.228 | 64 | Good | 520 | 7.0 |
| Example 8 | 1.504 | 0.069 | 3.227 | 64 | Good | 530 | 7.0 |
| Comparative Example 1 | 1.495 | 0.105 | 3.223 | 63 | — | 530 | 7.0 |
| Comparative Example 2 | 1.501 | 0.053 | 3.290 | 72 | Good | 360 | 6.3 |
| Comparative Example 3 | 1.491 | 0.059 | 3.299 | 73 | Good | 370 | 6.2 |
| Comparative Example 4 | 1.499 | 0.065 | 3.151 | 55 | Good | 350 | 7.8 |
| Comparative Example 5 | 1.502 | 0.062 | 3.271 | 69 | Good | 350 | 6.5 |
| Comparative Example 6 | — | — | — | — | Poor Shape Retention | — | — |
| Comparative Example 7 | — | — | — | — | Poor Shape Retention | — | — |
| Comparative Example 8 | — | — | — | — | Poor Shape Retention | — | — |
| Comparative Example 9 | 1.502 | 0.112 | 3.217 | 63 | Good | 480 | — |
| Comparative Example 10 | — | — | — | — | Unmoldable | — | — |
| Comparative Example 11 | — | — | — | — | Unmoldable | — | — |

TABLE 3

| Type | Molding Method | Target Thickness (mm) | Diamond Molded Body Average In-plane Thickness Difference (mm) |
|---|---|---|---|
| Example 9 | Pressing | 1.5 | 0.024 |
| Example 10 | Pressing | 1.0 | 0.021 |
| Example 11 | Pressing | 2.0 | 0.032 |
| Example 12 | Doctor Blading | 0.7 | 0.028 |
| Example 13 | Doctor Blading | 0.5 | 0.031 |
| Comparative Example 12 | Pressing | 2.5 | 0.038 |
| Comparative Example 13 | Doctor Blading | 0.4 | — |

TABLE 4

| Type | Composite Average Thickness (mm) | Composite Average In-plane Thickness Difference (mm) | Density (g/cm$^3$) | Diamond Content (% by volume) | Shape Retention | Thermal Conductivity (W/mK) | Coefficient of Thermal Expansion (×10$^{-6}$/K, from 25° C. to 150° C.) |
|---|---|---|---|---|---|---|---|
| Example 9 | 1.501 | 0.061 | 3.228 | 64 | Good | 470 | 7.0 |
| Example 10 | 0.998 | 0.050 | 3.229 | 65 | Good | 480 | 6.9 |
| Example 11 | 2.012 | 0.080 | 3.229 | 66 | Good | 480 | 6.9 |
| Example 12 | 0.710 | 0.065 | 3.228 | 64 | Good | 470 | 7.0 |
| Example 13 | 0.489 | 0.043 | 3.229 | 65 | Good | 480 | 6.9 |
| Comparative Example 12 | 2.510 | 0.120 | 3.227 | 63 | Good | 470 | 7.0 |
| Comparative Example 13 | — | — | — | — | Poor Shape Retention | — | — |

DESCRIPTION OF REFERENCE NUMERALS 1 aluminum-diamond-based composite
2 composite portion
3a, 3b surface layer
4a, 4b mold member
5a, 5b mold release plate
6 diamond molded body
7a, 7b metal plate
8a, 8b aluminum or aluminum alloy foil

What is claimed is:

1. A method for producing an aluminum-diamond-based composite, comprising following steps 1) to 6):
   1) adding 0.5 to 20 parts by mass of at least one organic binder and 10 to 60 parts by mass of at least one solvent to 100 parts by mass of diamond powder to obtain a slurry, wherein the diamond powder comprises 10 to 40% by volume of diamond particles each having a particle diameter of 1 μm or more and 20 μm or less, 50 to 80% by volume of diamond particles each having a particle diameter of 100 μm or more and 250 μm or less, and wherein the diamond powder does not comprise diamond particles each having a particle diameter of less than 1 μm and diamond particles each having a particle diameter of more than 250 μm;
   2) molding the slurry to prepare a flat plate-shaped molded body of diamond particles, wherein the flat plate-shaped molded body has an average value of in-plane thickness differences of 100 μm or less in a square of 50 mm×50 mm;
   3) forming a structured body in which the molded body is filled in a mold member while sandwiching both surfaces of the molded body by aluminum foils or aluminum alloy foils and mold release plates, heating the structured body at a temperature higher than or equal to a decomposition temperature of the organic binder and then compressing the structured body in a thickness direction;
   4) heating the structured body at a temperature of from 600 to 750° C.;
   5) impregnating the structured body heated at a temperature of from 600 to 750° C. with aluminum or aluminum alloy heated at a temperature higher than or equal to its melting point to form a flat plate-shaped aluminum-diamond-based composite base material in which both surfaces of the base material are coated with surface layers each containing a metal whose main component is aluminum; and
   6) processing the aluminum-diamond-based composite base material.

2. The method for producing the aluminum-diamond-based composite according to claim 1, wherein the method further comprises a step of processing the diamond molded body, after the step 2) and before the step 3) of heating the diamond molded body.

3. The method for producing the aluminum-diamond-based composite according to claim 1, wherein the step 6) of processing the aluminum-diamond-based composite base material comprises carrying out at least one of a side surface-processing and a hole portion-forming.

4. The method for producing the aluminum-diamond-based composite according to claim 1, wherein each of the diamond particles comprises a layer of β-silicon carbide chemically bonded to a surface of each diamond particle.

5. A flat plate-shaped aluminum-diamond-based composite comprising an aluminum-diamond-based composite portion; and a surface layer containing a metal whose main component is aluminum, the surface layer covering both sides of the composite portion, wherein the composite portion comprises a matrix of aluminum or an aluminum alloy and diamond particles dispersed in the matrix;
   wherein the diamond particles comprise 10 to 40% by volume of diamond particles each having a particle diameter of 1 μm or more and 20 μm or less, 50 to 80% by volume of diamond particles each having a particle diameter of 100 μm or more and 250 μm or less, and do not comprise diamond particles each having a particle diameter of less than 1 μm and diamond particles each having a particle diameter of more than 250 μm; and
   wherein the aluminum-diamond-based composite has an average value of in-plane thickness differences of 100 μm or less in a square of 50 mm×50 mm.

6. The aluminum-diamond-based composite according to claim 5, wherein the aluminum-diamond-based composite has a thermal conductivity at a temperature of 25° C. of 400 W/mK or more.

7. The aluminum-diamond-based composite according to claim 5, wherein the aluminum-diamond-based composite has a density of from 3.02 to 3.28 g/cm$^3$.

8. The aluminum-diamond-based composite according to claim 5, wherein the aluminum-diamond-based composite has an average thickness of from 0.48 to 2.2 mm.

9. A heat dissipating member for a semiconductor element, comprising the aluminum-diamond-based composite according to claim 5.

* * * * *